(12) United States Patent
Matsumoto

(10) Patent No.: US 6,759,334 B2
(45) Date of Patent: Jul. 6, 2004

(54) SEMICONDUCTOR MANUFACTURING APPARATUS AND METHOD

(75) Inventor: Ken Matsumoto, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/242,736

(22) Filed: Sep. 13, 2002

(65) Prior Publication Data

US 2003/0077912 A1 Apr. 24, 2003

Related U.S. Application Data

(62) Division of application No. 09/650,992, filed on Aug. 31, 2000, now Pat. No. 6,471,037.

(30) Foreign Application Priority Data

Sep. 1, 1999 (JP) ......................................... 1999-247770

(51) Int. Cl.[7] .............................................. H01L 21/461
(52) U.S. Cl. ........................................ 438/692; 454/187
(58) Field of Search ........................ 454/187; 29/25.01; 438/692, 725; 364/578; 257/192; 204/192.13

(56) References Cited

U.S. PATENT DOCUMENTS

| 4,532,970 A | 8/1985 | Tullis et al. ................... 141/98 |
| 4,534,389 A | 8/1985 | Tullis .......................... 141/98 |
| 4,616,683 A | 10/1986 | Tullis et al. .................. 141/98 |
| 5,401,212 A | * 3/1995 | Marvell et al. ............. 454/187 |
| 5,563,095 A | 10/1996 | Frey ........................... 437/141 |
| 5,912,184 A | * 6/1999 | Young ......................... 438/692 |
| 6,099,598 A | * 8/2000 | Yokoyama et al. ........ 29/25.01 |
| 6,279,724 B1 | 8/2001 | Davis ....................... 198/465.2 |

FOREIGN PATENT DOCUMENTS

| JP | 5-66733 | 9/1993 |
| JP | 8-316137 | 11/1996 |
| JP | 10-116772 | 5/1998 |
| JP | 11-87459 | 3/1999 |

* cited by examiner

Primary Examiner—John F. Niebling
Assistant Examiner—Andre C. Stevenson
(74) Attorney, Agent, or Firm—Fitzpatrick, Cella, Harper & Scinto

(57) ABSTRACT

Disclosed is a semiconductor manufacturing apparatus which includes a chamber having an environment-controlled inside space, a stage disposed in the inside space of the chamber and for holding a substrate to perform a predetermined process to the substrate, a temporary storage for temporarily storing one or more substrates in a local environment being independent from the chamber inside, a robot for conveying a substrate between the stage and the temporary storage, and a controller for controlling the robot so that the substrate is stored into the temporary storage when the environment control of the chamber inside space is suspended.

15 Claims, 9 Drawing Sheets

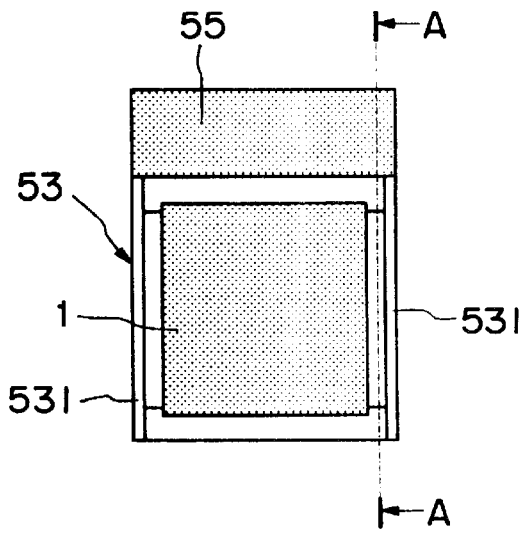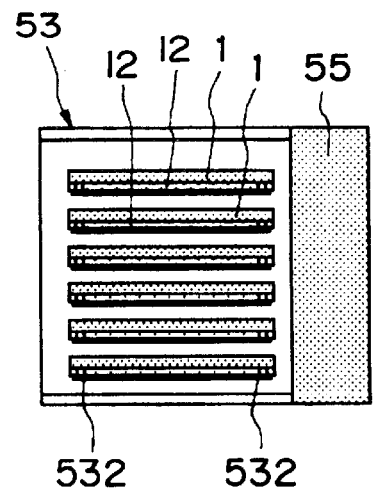
FIG. 5A    FIG. 5B
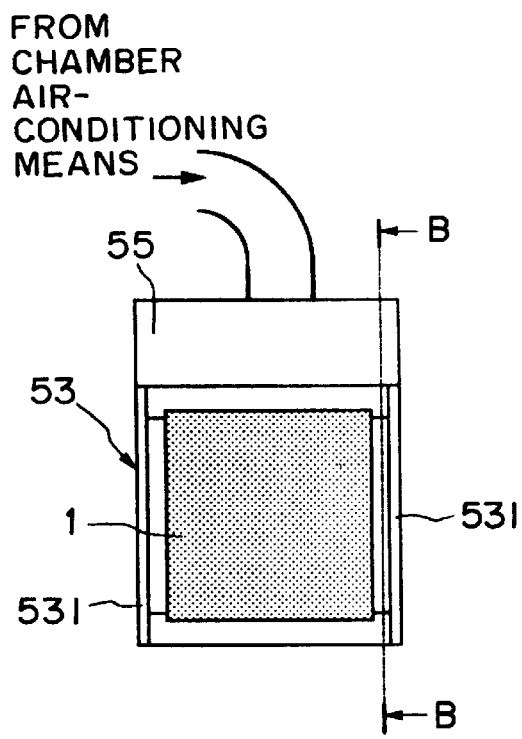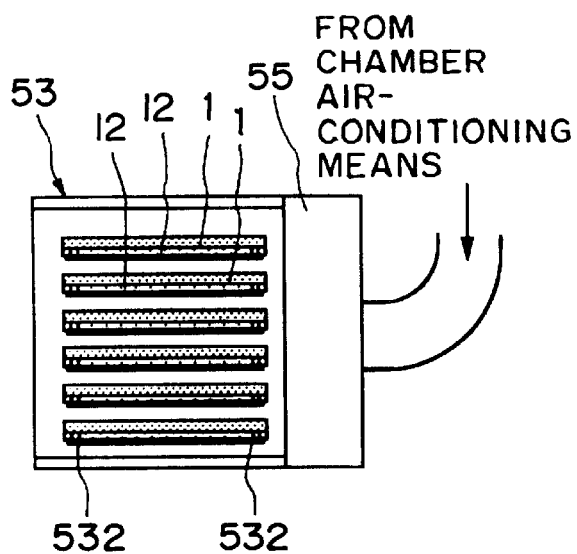
FIG. 6A    FIG. 6B

SEMICONDUCTOR MANUFACTURING APPARATUS AND METHOD

CROSS-REFERENCE TO THE RELATED APPLICATION

This application is a division of application Ser. No. 09/650,992, filed on Aug. 31, 2000 is now U.S. Pat. No. 6,471,037.

FIELD OF THE INVENTION AND RELATED ART

This invention relates to a substrate handling technology in an apparatus for manufacturing a semiconductor such as LSI, for example. More particularly, the present invention is suitably usable in a semiconductor manufacturing apparatus such as a processing apparatus, a cleaning apparatus or an inspection apparatus, for example, for performing a certain process for semiconductor manufacture in which a substrate (plate-like article) such as a mask or a reticle (hereinafter, "reticle"), or a silicon wafer or a glass plate (hereinafter, "wafer") is handled to be treated.

Semiconductor manufacturing processes use various semiconductor manufacturing apparatuses for performing various operations in the processes. The semiconductor manufacture is carried out in a clean room in which the cleanness is kept extraordinarily high. Particularly, as regards an apparatus for a certain process such as an exposure process in which very strict dust-particle control is required, an environment of highest cleanness of an order of 0.1–0.2 micron particle diameter (Class 1) must be maintained.

In the case of a system in which a clean room as a whole is cleaned by "down flow", it needs use of a huge air-conditioning machine and, thus, the equipment cost and the running cost are very large. In consideration of it, the concept of local cleaning wherein, only in a limited small space, the cleanness is to be improved, has been developed. A representative example is the concept of mini-environment, called SMIF (Standardized Mechanical Inter-Face) or FOUP (Front Opening Unified Pod), such as disclosed in U.S. Pat. Nos. 4,532,970, 4,534,389, and 4,616,683.

Where the concept of mini-environment is employed, however, the cleanness of the clean room itself is not improved. For example, it might be of an order of 0.3 micron particle diameter (Class 1000). This raises another problem. The semiconductor manufacturing apparatuses require frequent maintenance to keep their performance, and the inside space of a chamber has to be opened often. For example, in an exposure apparatus, there are some items such as a wafer chuck which need a daily maintenance. Thus, when the chamber is kept opened for a long time for such maintenance, there is a possibility of contamination of the chamber by small particles contained in the air entered into the chamber from the clean room. If, for example, there is a substrate in process which is left in the apparatus, the surface of the substrate may be contaminated by the chamber opening.

SUMMARY OF THE INVENTION

It is accordingly an object of the present invention to prevent contamination of a substrate inside an apparatus where the environment control for the chamber inside space is suspended due to the maintenance operation or the like.

In accordance with an aspect of the present invention, there is provided a semiconductor manufacturing apparatus, comprising: a chamber having an environment-controlled inside space; a stage disposed in the inside space of said chamber and for holding a substrate to perform a predetermined process to the substrate; a temporary storage for temporarily storing one or more substrates in a local environment being independent from the chamber inside; a robot for conveying a substrate between said stage and said temporary storage; and a controller for controlling said robot so that the substrate is stored into said temporary storage when the environment control of the chamber inside space is suspended.

In accordance with another aspect of the present invention, there is provided a semiconductor manufacturing apparatus, comprising: a chamber having an inside space; a stage for holding a substrate to perform a predetermined process to the substrate; a temporary storage disposed in the inside space of said chamber, for temporarily storing one or more substrates in a local environment being independent from the chamber inside; and a robot for conveying a substrate between said stage and said temporary storage.

In accordance with a further aspect of the present invention, there is provided a semiconductor manufacturing method, comprising the steps of: introducing a substrate into a chamber having an environment-controlled inside space; performing a process for semiconductor manufacture to the substrate; temporarily storing the substrate into a buffer space, which is defined in the chamber inside space and in which a local environment control is performed independently from the chamber inside space, in a predetermined period in which the predetermined process is not carried out; and unloading the substrate having been treated by the predetermined process, out of the chamber.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A and 5B are schematic views, respectively, for explaining the structure of a reticle library having an air-conditioning unit for producing a gas flow.

FIGS. 6A and 6B are schematic views, respectively, for explaining the structure of a reticle library having a function for producing a gas flow by use of a chamber air-conditioning unit.

DESCRIPTION OF THE PREFERRED EMBODIMENTS

Preferred embodiments of the present invention will now be described with reference to the accompanying drawings.

First, an embodiment wherein the present invention is applied to a semiconductor exposure apparatus (called a stepper), as an example of a semiconductor manufacturing apparatus, will be described.

Figure 1:
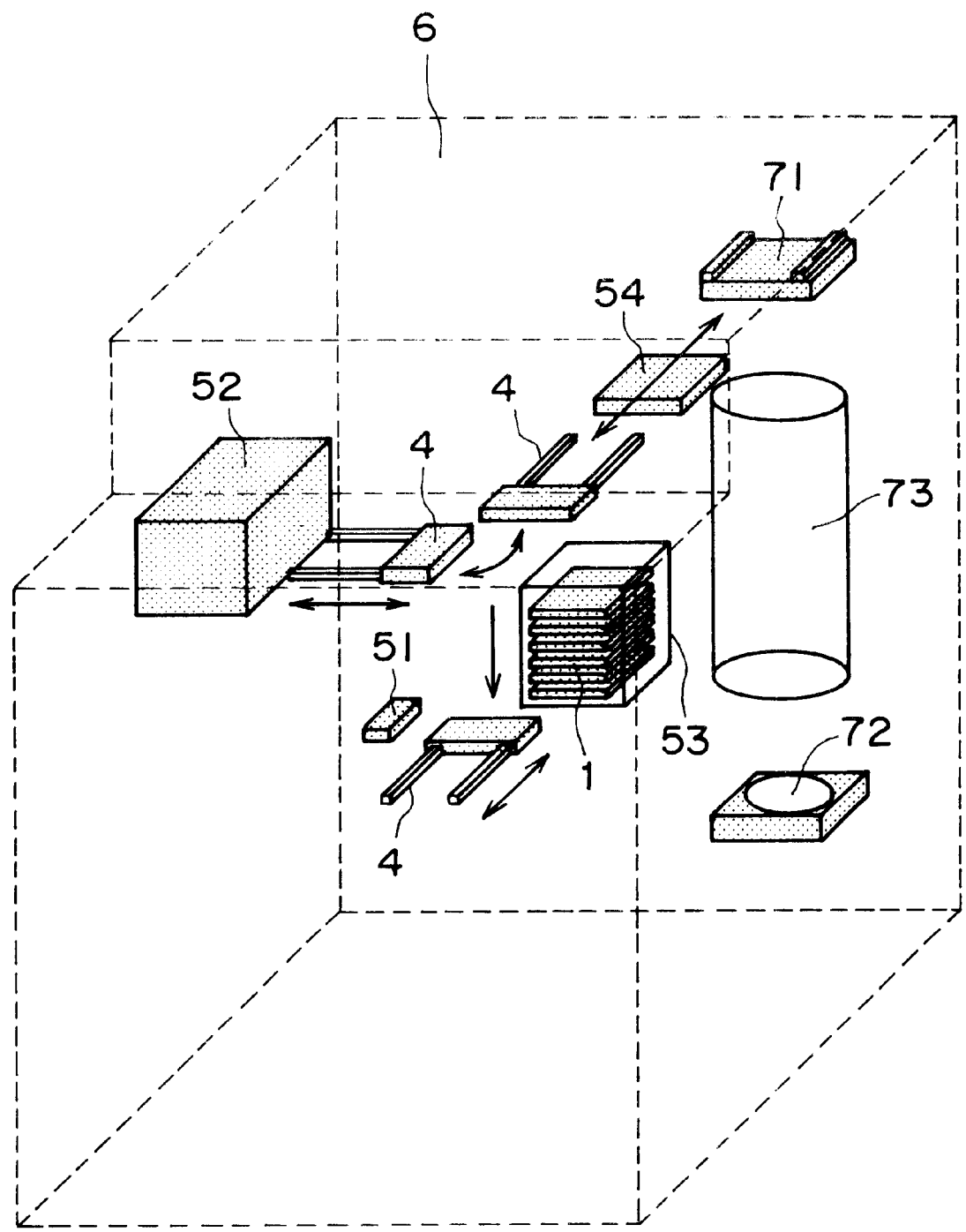
FIG. 1 is a schematic view for explaining the structure of a semiconductor exposure apparatus.
Figure 2:
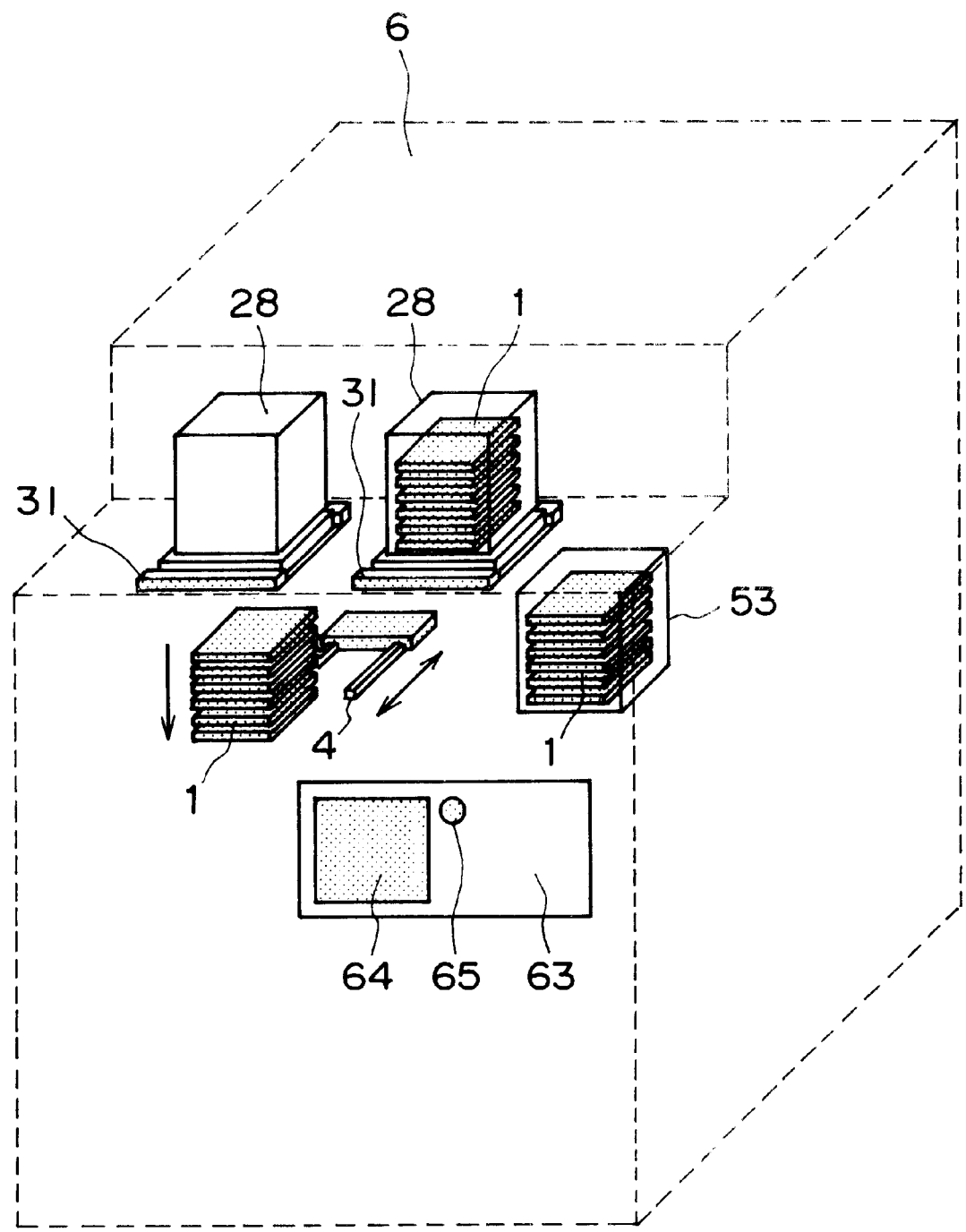
FIG. 2 is a schematic view for explaining the structure of a semiconductor exposure apparatus.

Generally, in a semiconductor manufacturing factory, there are various manufacturing apparatuses, including an exposure apparatus, disposed in a clean room along the manufacturing line. FIGS. 1 and 2 show the structure particularly in respect to certain portions of an exposure apparatus, respectively. The exposure apparatus is covered by a chamber 6, and the inside space of it is environment-controlled independently of the clean room environment. More specifically, by means of an air-conditioning machine or machines provided for respective apparatuses (the machine may be provided inside or outside the chamber 6), a dry air or a certain inert gas such as nitrogen or helium, for example, is supplied into and circulated in the inside space of the chamber 6. The environment thereof such as the temperature, humidity, pressure, cleanness and gas purity of the gas is controlled very precisely, and independently of the clean room. The control of the apparatus as a whole such as the air-conditioning control and reticle conveyance control as well as exposure control is performed by using a controller 10 having a computer. The chamber has a maintenance cover which can be opened and closed for the maintenance operation to be performed in the apparatus.

In FIG. 1, an exposure station inside the chamber has a reticle stage 71, a wafer stage 72, and a projection optical system 73. A light source to be used for an exposure process may be an excimer laser, EUV, X-ray, electron beam, or ion beam. In FIG. 2, at a front wall of the chamber 6, there is an operation panel 63 for an operator. More specifically, it comprises a display 64 of touch panel input type (a keyboard may be provided separately) and a display lamp 65. An inspection machine 52 is provided inside the chamber 6 for inspection of dust such as fine particles adhered to a reticle, for example.

As regards reticles to be used in exposure processes, one or more reticles are accommodated in a carrier 28, and, while being kept therein, they are conveyed in the clean room, from a reticle stocking unit to respective exposure apparatuses, manually or by means of an automatic conveying mechanism such as AGV (Automated Guided Vehicle) or OHT (Over-Head Transfer). During the conveyance, the carrier 28 is tightly closed. Therefore, even if the cleanness of the clean room is not very good, there occurs no adhesion of dust particles to reticles accommodated in the carrier. Then, as shown in FIG. 2, the carrier 28 is mounted on a load port 31 provided on the chamber 6 of the exposure apparatus. There are plural load ports 31 (two in this embodiment) which are disposed along a horizontal direction, at a stepped portion formed at the front face of the chamber 6. The carrier 28 may be loaded on any load port.

A reticle 1 in the thus loaded carrier 28 is unloaded from the carrier 28 by means of an elevator, and thus it is exposed to the inside space of the chamber 6. A reticle conveyance robot 4 is movable as desired within the chamber 6 to convey reticles, one by one, between the carrier 28, the reticle stage 71, the inspection machine 52, and the reticle library 53, for example. A reticle ID reader 51 serves to read a code recorded on a reticle, for checking or registering the reticle ID. As required, the inspection apparatus 52 performs inspection of any dust particle adhered to the reticle surface. Thereafter, at a reticle prealignment station 54, rough alignment of the reticle 1 with respect to the reticle stage 71 is carried out. Subsequently, the reticle 1 is placed on the reticle stage 71. After precise alignment, the reticle is held by the stage and then the exposure process is performed.

The reticle library 53 is provided in this embodiment as a reticle temporary storage for temporarily storing one or more reticles therein. Although it is in the chamber inside space, it provides a buffer space in which local environment control being independent from the chamber inside space is to be performed. For shortening the reticle conveyance time, the reticle library 53 should preferably be disposed at a position close to the reticle stage 71 as much as possible. Where a process schedule of a reticle or reticles to be used is predetermined, the reticle or reticles having been inspected by the inspection machine 52 may be temporarily accommodated in the reticle library 53. This reduces the reticle replacement time required for the reticle supply and re-collection.

Figure 3A:
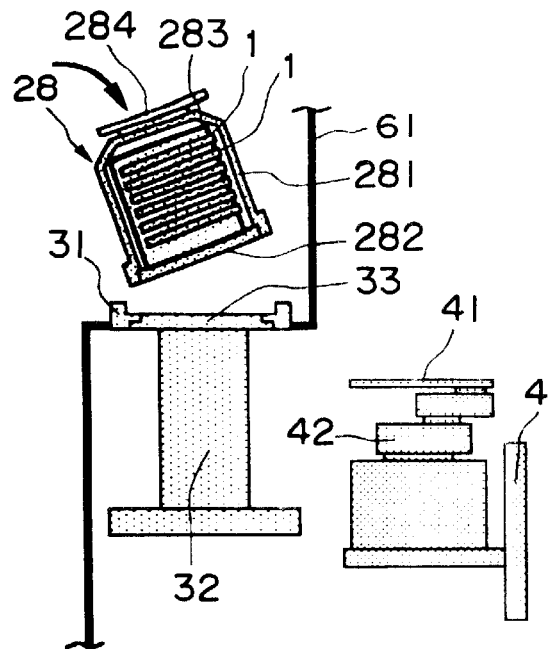
FIGS. 3A–3D are schematic views, respectively, for explaining the procedure for introducing a reticle from a load port.

FIGS. 3A–3D show details around the load port. More specifically, FIG. 3A shows the state in which the carrier 28 having been conveyed manually by an operator or automatically by AGV or OHT, for example, is just being loaded on the load port 31. Inside the carrier 28, there is a reticle carrier library 283 having plural slots for storing one or more reticles 1 therein. A carrier cover 281 covers the reticle carrier library 283, and its opening is gas-tightly closed by a carrier door 282.

Figure 3B:
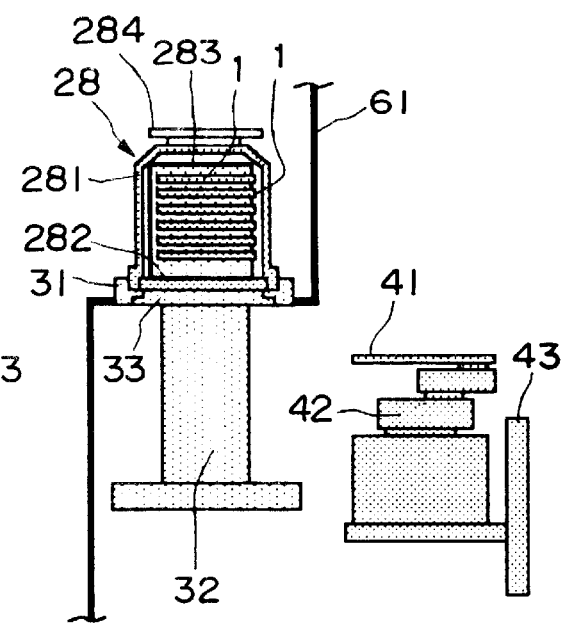

FIG. 3B shows the state in which the loading of the carrier 28 at the load port 31 is completed. The carrier cover 281 is held fixed to the load port 31 by means of a clamp mechanism. A load port door 33 serves to seal the opening of the load port 31, when the carrier 28 is not set there, to keep the gas-tightness of the chamber 6. Inside the load port door 33, there are an unlocking mechanism for releasing the lock of the carrier door 28, and a holding mechanism such as a vacuum attraction mechanism, for example, for holding the carrier door 282 and the load port door 33 as a unit. After the carrier 28 is set at the load port 31, the lock of the carrier is released by the unlocking mechanism and, simultaneously therewith, the carrier door 282 and the load port door 33 are held as a unit by means of the holding mechanism. Even if there are dust particles adhered to the outside faces of these doors, the dust particles are trapped between the carrier door 28 and the load port door 33. Thus, the particles do not enter the carrier.

Figure 3C:
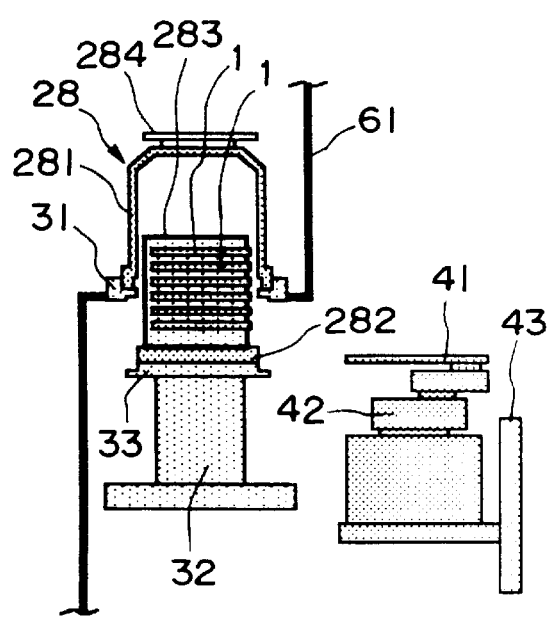

FIG. 3C shows the state in which the reticle carrier library 283 is pulled out of the carrier 28 to take a reticle 1 out of it. As an elevator 32 is lowered down, the carrier door 282 and the reticle carrier library 233 are pulled downwardly from the carrier cover 281. By this, the reticle 1 is exposed to the inside space of the chamber wall 61.

Figure 3D:
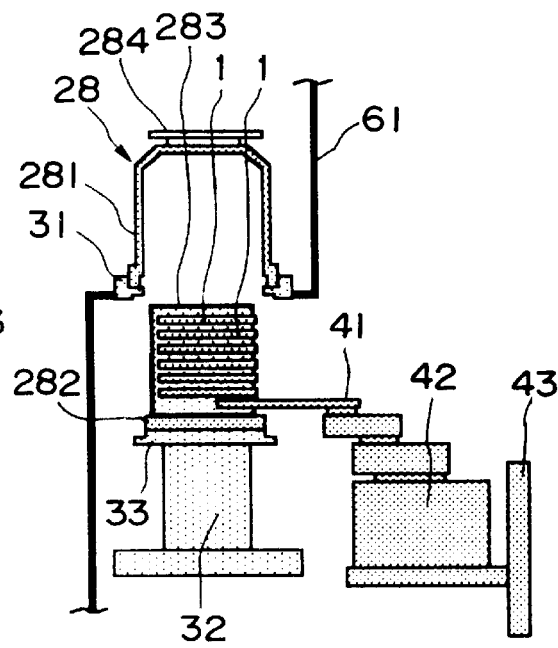

FIG. 3D shows the state in which the downward motion of the elevator 32 is completed, and the loading of the reticle 1 is completed. A hand 41 of the reticle conveyance robot 42 can access to a reticle 1 is placed at any slot of the reticle carrier library 283 to pull it out of the library or to move it back to the library. For the access to any slot, the hand 41 has be to moved upwardly or downwardly. This upward/downward motion is provided by an elevating mechanism 43.

Figure 4A:
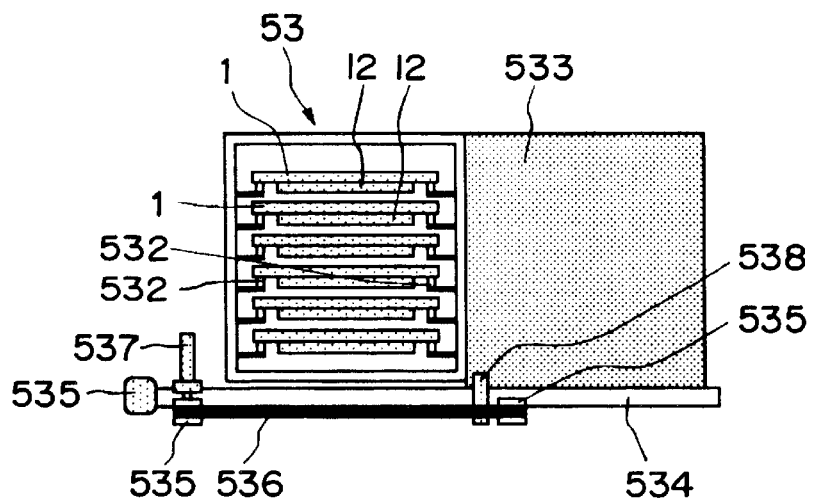
FIGS. 4A–4C are schematic views, respectively, for explaining the structure and operation of a reticle library.
Figure 4B:
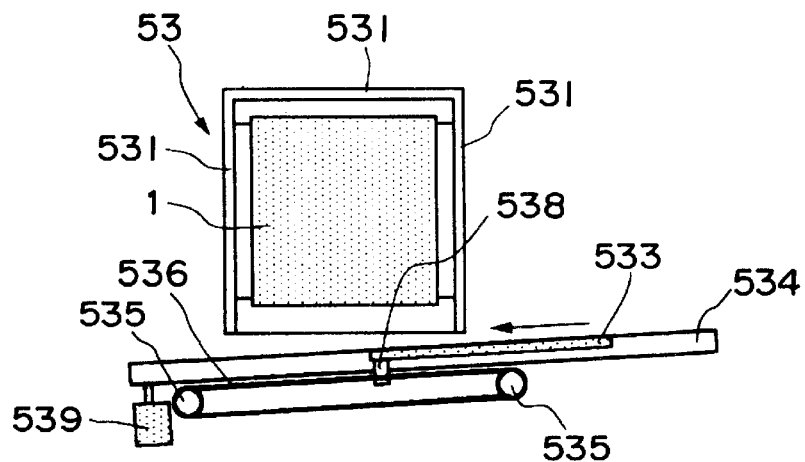
Figure 4C:
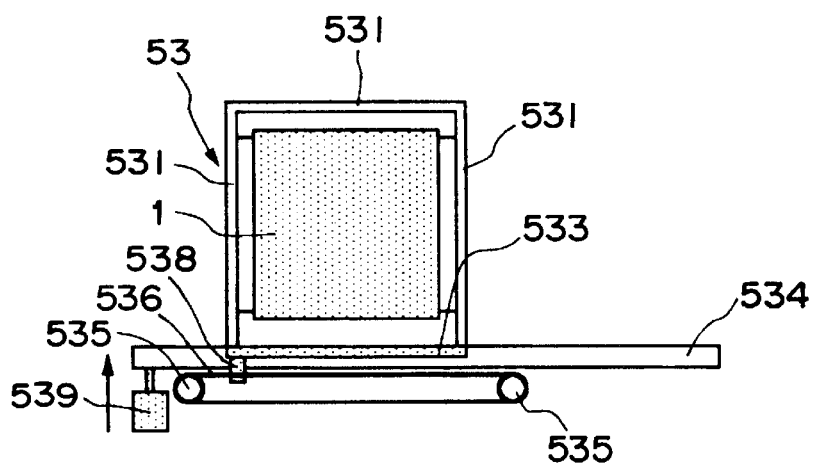

FIGS. 4A–4C show details of the structure of the reticle library 53 which is provided inside the exposure apparatus. More specifically, FIG. 4A is a front view, and FIGS. 4B and 4C are top plan views. In FIGS. 4B and 4C, the top wall is not shown, for illustration of the inside structure. The reticle library 53 has a cubic box-like structure wherein the five faces thereof are encircled by a wall 531 and wherein an opening is defined at only one face for reticle unloading. There are plural slots formed therein for accommodation of plural reticles therein. Also, there are plural reticle supports 532 in association with the slots, respectively. Each reticle 1 can be supported inside the reticle library, by means of these reticle supports 532. A closing cover 533 serves to sealingly close the opening of the reticle library 53. The cover 533 is coupled to a belt 535 through a connector 538, and it can be slidingly moved in leftward and rightward directions in the drawing, while being guided by a guide 534, by means of a driving mechanism comprising a belt 536, a pulley 535 and a motor 537. The cover 533 is subsequently pressed against the opening of the reticle library 53, by means of a gas cylinder 539, to close the opening, by which the inside space of the reticle library 53 can be completely gas-tightly closed. Where a maintenance door of the chamber 6 is to be opened and thus the inside space thereof is to be opened, for the maintenance of the exposure apparatus, for example, namely, when the environment control of the chamber is to be temporarily released, a reticle which is inside the exposure apparatus is temporarily sheltered into the reticle library 53 and the closure cover 533 is then closed. This procedure much reduces the possibility of contamination of that reticle by dust particles during the maintenance operation.

Figure 7:
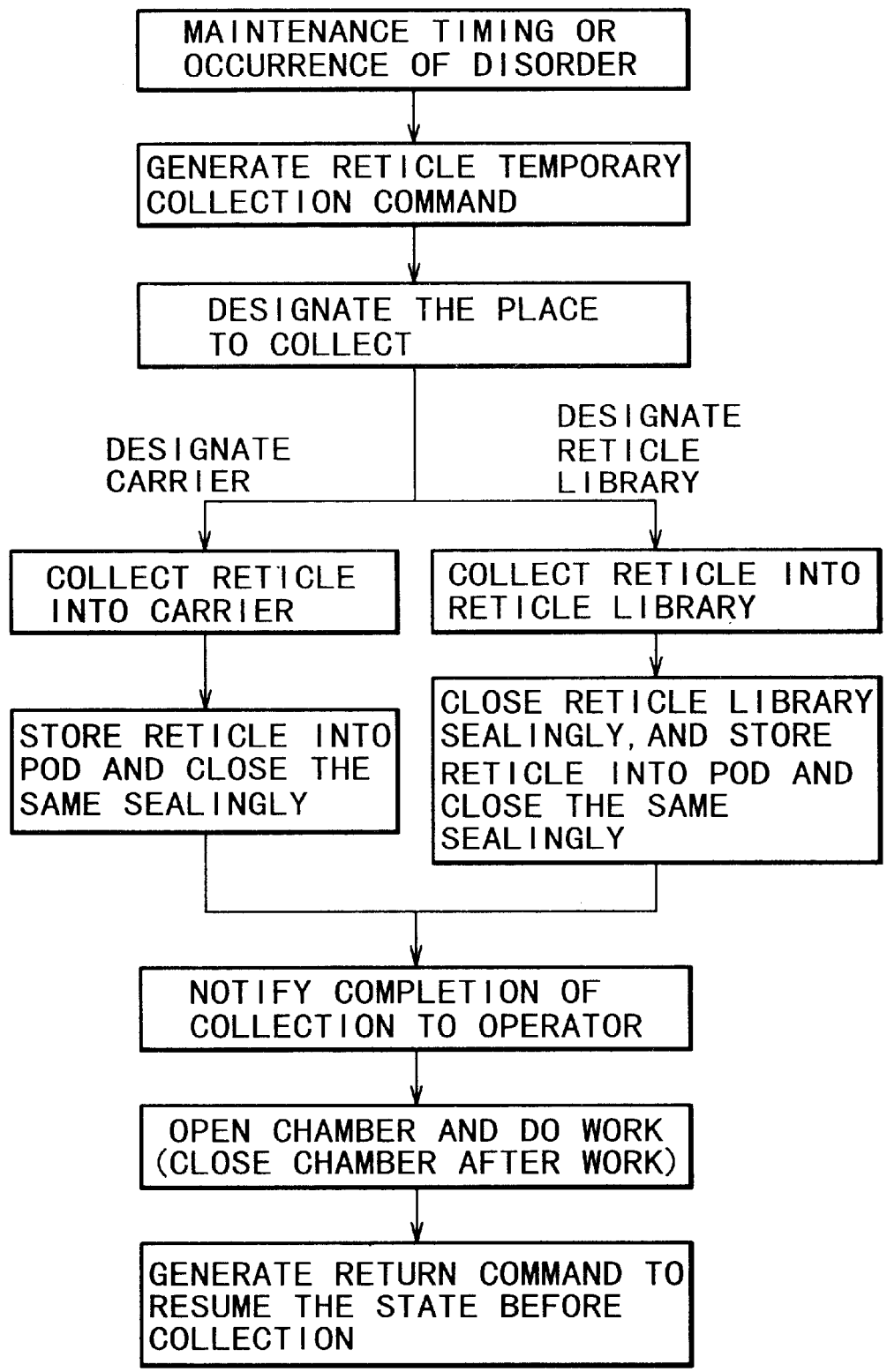
FIG. 7 is a flow chart for explaining the procedure for temporarily sheltering a reticle during a maintenance operation.

Referring now to the flow chart of FIG. 7, the procedure for reticle sheltering at the maintenance operation will be described. At the time of periodic maintenance of the apparatus or at an emergency maintenance to be made to meet any unexpected disorder, the maintenance cover of the chamber is opened so that the inside thereof is made open. In that occasion, the operator first operates the panel of the display 64 (FIG. 2) to generate a reticle temporary collection command. In response to it, the controller 10 prompts, through a display on the display panel 64, the operator to designate the location (destination) where the reticle is to be collected. The selectable options for temporary storage for the reticle to be collected, are the carrier 28 and the reticle library 53. In accordance with the selection made by the operator, the controller 10 controls the reticle conveyance robot 4 to collect a reticle or reticles, which may be at the reticle stage 71, the prealignment position 54, the dust particle inspection machine 52, the conveyance robot 4, or the like, into the designated temporary storage, by which the reticle sheltering is accomplished. Where the carrier 28 is selected, all the reticles are collected into the reticle carrier library 283 and, thereafter, the reticles are accommodated into the carrier cover 281 by means of the elevator 32. Then, the carrier is tightly closed by the carrier door 282. If on the other hand the reticle library 53 is selected as the destination of collection, all the reticles are collected into the library 53 and, thereafter, the inside of the reticle library 53 is tightly closed by using the mechanism as described with reference to FIGS. 4A–4D. Further, where there is a reticle or reticles left in the reticle carrier library 283, they are stored into the carrier cover 281 by using the elevator 32. After these sheltering operations are accomplished, the completion of reticle sheltering is notified to the operator through the lamp 65 on the operation panel 63 as well as an alarm sound. The operator checks it and then opens the maintenance door of the chamber 6 to open the inside space. Then, the maintenance is initiated. After the maintenance is completed, the operator closes the maintenance door of the chamber and operates the touch panel to input the maintenance completion, whereby a return command is generated. The controller 10 has stored therein all the locations where reticles were present before the temporary sheltering. Thus, in response to the return command, it operates to restore the original condition.

Figure 8:
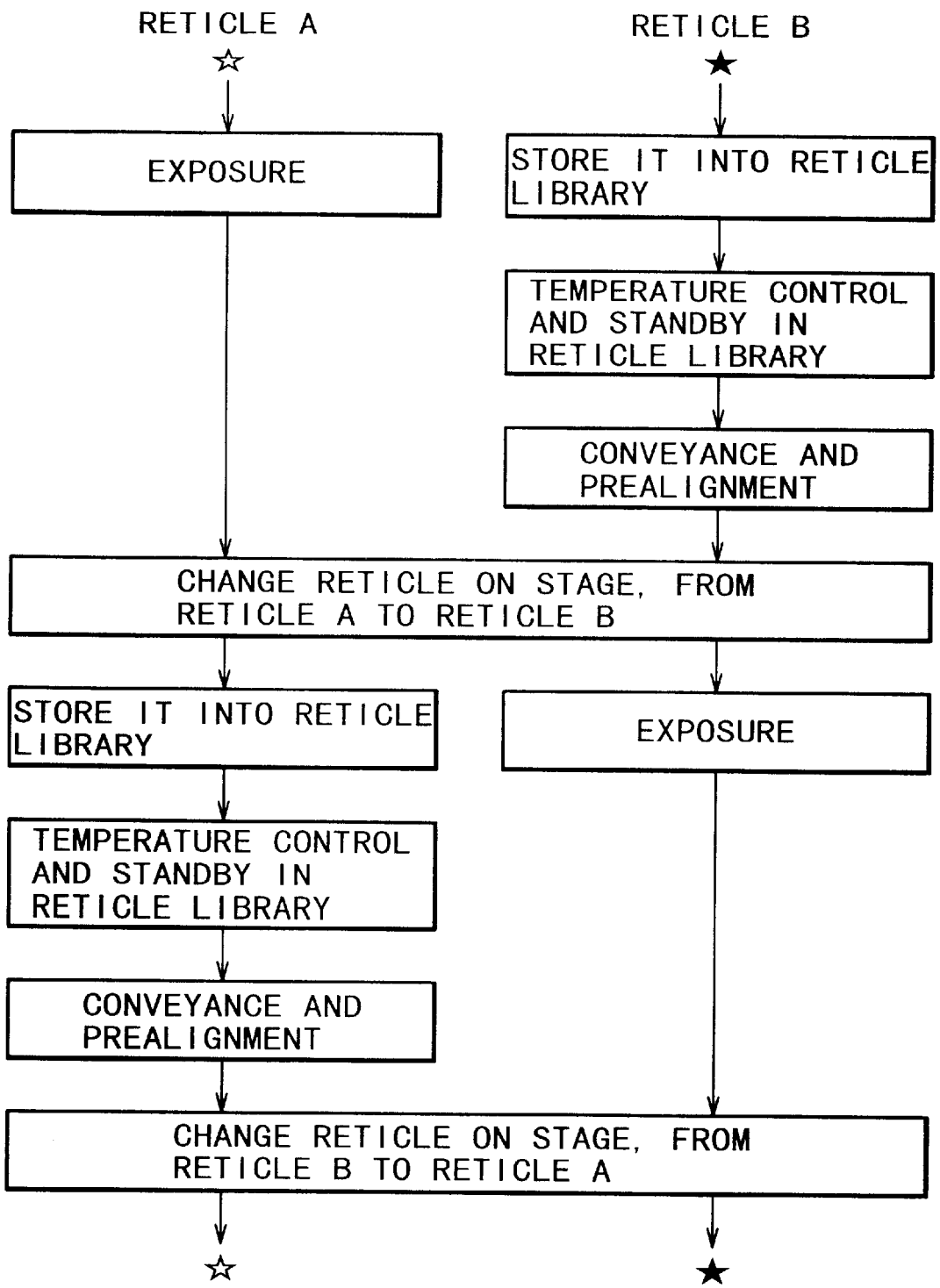
FIG. 8 is a flow chart for explaining the procedure for alternately using different reticles.

It should be noted here that the reticle library 53 does not always need a tightly closed structure. FIGS. 5A and 5B show a modified example wherein a clean gas is continuously supplied into the reticle library 53 by means of an air-conditioning machine 55 provided specifically in association with the library. By this, the gas pressure inside the library 53 can be kept at a slightly positive pressure as compared with the pressure surrounding it. Thus, it is environment-controlled substantially independently of the periphery. Also, where the controlled temperature of a substrate is equal to the temperature to be controlled inside the chamber, as shown in FIGS. 6A and 6B, a purified gas may be directly supplied from the air-conditioning machine of the chamber. This eliminates the necessity of using the air-conditioning machine 55 (FIG. 5A) specifically for the reticle library 53.

Where a reticle library such as shown in FIG. 5A or 5B is used, reticles within the library can be kept at a desired temperature. Thus, in this embodiment, during a period in which a certain reticle is being used in an exposure process, another reticle to be used subsequently is kept standby in the reticle library and the temperature control is made thereto so that it reaches an appropriate temperature. FIG. 8 illustrates the procedure for using a reticle A and a reticle B alternately to perform exposures. The longitudinal direction in the flow chart corresponds to the time axis. At a certain initial moment, the reticle A is present on the reticle stage 71 and it is being used for an exposure process to a certain wafer. During this period, the reticle B to be used for a subsequent exposure process is stored into the reticle library 53. By using a gas flow having a predetermined temperature, the reticle B is temperature-controlled so that the temperature becomes close to the gas flow temperature. The reticle B is thus kept standby in the reticle library 53. As the exposure process using the reticle A comes close to the end, the reticle B is conveyed out of the reticle library 53 at such timing that enables prompt reticle replacement, and then the prealignment of it is carried out at the alignment station 54. Then, the reticle A on the reticle stage 71 is replaced by the reticle B. Subsequently, the exposure process to the same wafer and using the reticle B is initiated. On the other hand, the collected reticle A is stored into the reticle library 53 for preparation of a subsequent exposure. It is kept standby while similar temperature adjustment is made thereto. Just before completion of the exposure process using the reticle B, at a similar timing as described above, the conveyance of the reticle A is initiated, and the prealignment thereof is made at the alignment station 54. Then, after completion of the exposure, the reticle replacement is carried out. Thereafter, the cycle is repeated. As regards a predetermined temperature to be controlled in the reticle library, it may be made substantially equal to the temperature of a chuck of the reticle stage. This minimizes distortion of the reticle pattern. Also, as regards the temperature controlling time at the reticle library 53, it may be determined by experiments for detecting the relationship among the reticle chuck, the reticle itself, and the gas flow temperature upon the reticle library 53. Further, temperature measuring means may be provided on the reticle library 53. This is particularly effective in a case where a multiple exposure process is to be performed by using two or more reticles for a single wafer. The period in which a certain reticle is being used for an exposure process, may be just a standby period for a subsequent reticle. However, by using this interval, the temperature control to the reticle to be used subsequently is carried out in the reticle library 53. This accomplishes a notable increase of throughput and, additionally, it reduces a thermal deformation of the reticle and therefore distortion of it. Therefore, the pattern transfer precision can be improved significantly.

Although the above-described examples concern use of a reticle, the present invention is not limited to it. Namely, strict dust particle control is necessary also for the side where a pattern is to be transferred, that is, a wafer or a glass plate. The present invention is applicable also to them similarly.

Next, an embodiment of a device manufacturing method using an exposure apparatus such as described above, will be explained.

Figure 9:
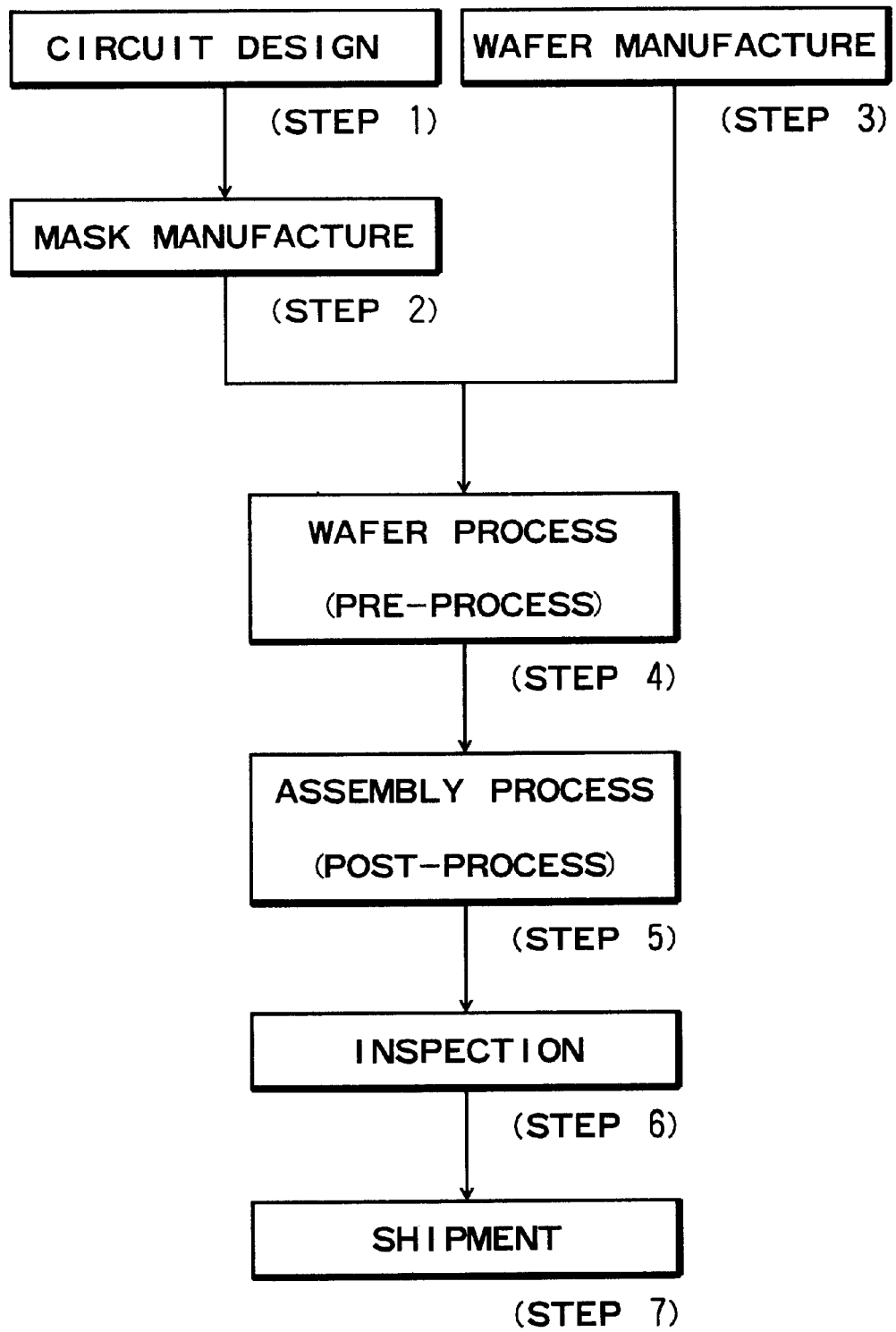
FIG. 9 is a flow chart of microdevice manufacturing processes.

FIG. 9 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 10:
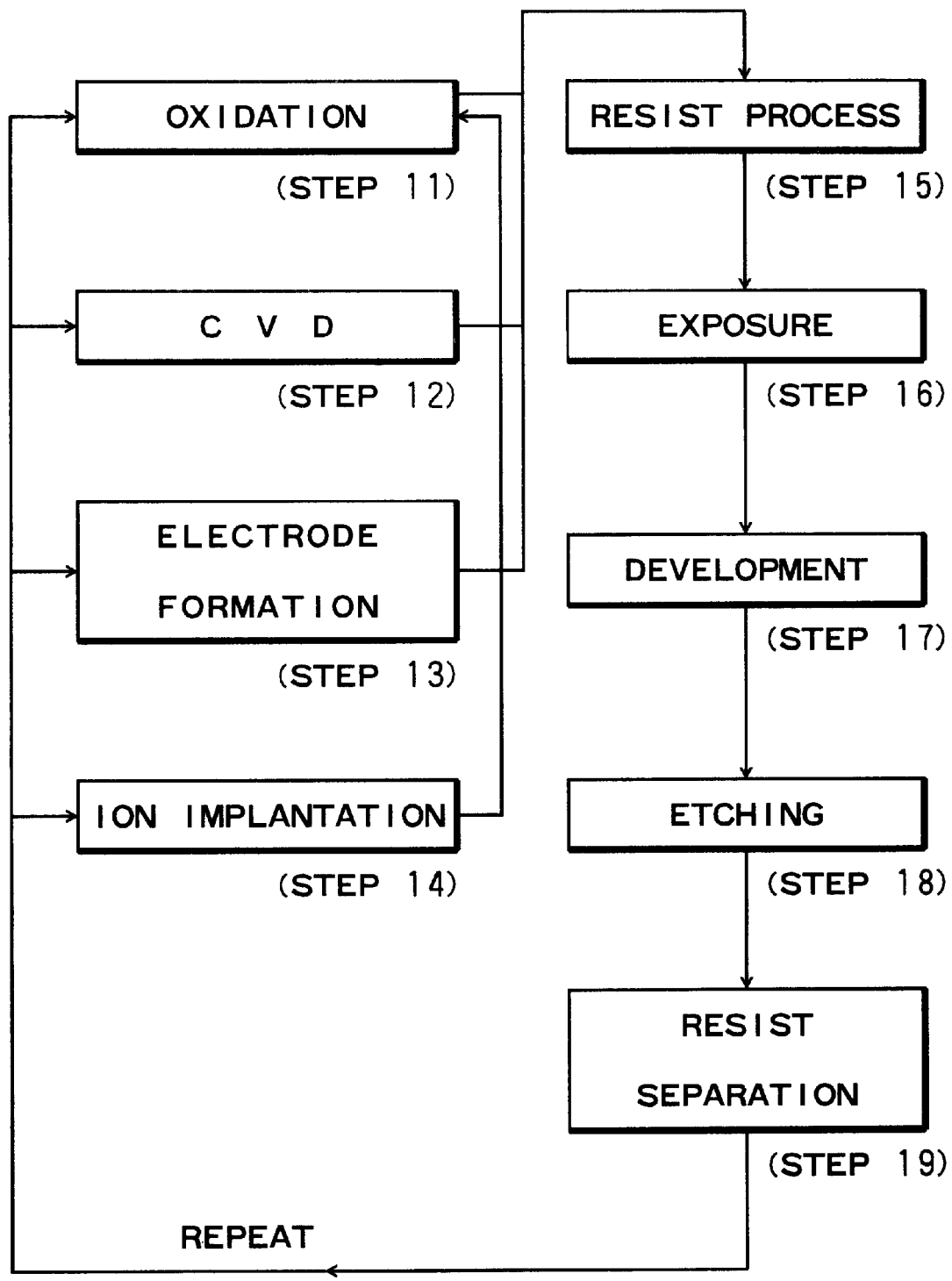
FIG. 10 is a flow chart for explaining details of a wafer process included in the procedure of FIG. 9.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor manufacturing method comprising the steps of:

performing a predetermined process for semiconductor manufacture to a substrate in a chamber having an environment-controlled interior space; and storing the substrate in a buffering space which is environmentally-controlled independently from said interior space when environment control of the interior spaced is suspended.

2. The method according to claim 1, wherein the buffering space includes a library disposed inside the chamber.

3. The method according to claim 1, wherein said buffering space includes a carrier mounted on the chamber.

4. The method according to claim 1, wherein said buffering space is environmentally-controlled independently from its periphery by tight closure or by use of a positive pressure.

5. The method according to claim 4, wherein a gas flow is produced inside the buffering space independently of the interior space.

6. The method according to claim 1, wherein the substrate is stored in the buffering space when maintenance related to the semiconductor manufacture is conducted.

7. The method according to claim 1, wherein each substrate is a reticle and a wafer, and wherein the predetermined process is an exposure process to be performed to the substrate.

8. A semiconductor manufacturing method comprising the steps of:

performing a predetermined process related to semiconductor manufacture to a substrate in a chamber having an interior space which is environmentally-controlled independently from an outside space; and storing the substrate in a buffering space defined in the chamber and being environmentally-controlled independently from the outside space and the interior space.

9. The method according to claim 8, wherein the buffering space is environmentally-controlled independently from its periphery by tight closure or by use of a positive pressure.

10. The method according to claim 8, wherein during conducting the predetermined process to the substrate another substrate to be processed subsequently is stored in the buffering space.

11. The method according the claim 10, wherein a gas flow is produced inside the buffering space, independently of the interior space.

12. The method according to claim 11, wherein the gas flow has a predetermined temperature effective to adjust a temperature of a substrate inside the buffering space.

13. The method according to claim 12, wherein the predetermined temperature is substantially equal to a temperature of a stage for holding the substrate.

14. The method according to claim 8, wherein the substrate is stored in the buffering space during a period for a maintenance operation in which the chamber is opened, and wherein the substrate in the buffering space is tightly closed or maintained under a positive pressure.

15. The method according to claim 8, wherein the substrate is stored in the buffering space during a period in which a second substrate is processed and wherein the substrate in the buffer space is temperature controlled.

* * * * *

UNITED STATES PATENT AND TRADEMARK OFFICE
CERTIFICATE OF CORRECTION

PATENT NO. : 6,759,334 B2  
DATED : July 6, 2004  
INVENTOR(S) : Ken Matsumoto

Page 1 of 1

It is certified that error appears in the above-identified patent and that said Letters Patent is hereby corrected as shown below:

Column 8,  
Line 4, "storing" should read -- temporarily storing --; and "space which" should read -- space inside the chamber, wherein said buffering space --;  
Line 7, "spaced" should read -- space --;  
Line 30, "storing" should read -- temporarily storing --; and "in" (second occurrence) should read -- within --;  
Line 32, "space." (second occurrence) should read -- space when environment control of the chamber is suspended. --;  
Line 49, "wherein" should read -- wherein when --;  
Line 50, "period" should read -- period when, environment control of the chamber is suspended --;  
Line 51, "and" should be deleted;  
Line 52, "wherein" should be deleted;  
Line 56, "wherein" should read -- temperature-controlling --;  
Line 57, "buffer" should read -- buffering --; and "space is temperature controlled." should read -- space. --.

Signed and Sealed this

Twelfth Day of October, 2004

JON W. DUDAS  
*Director of the United States Patent and Trademark Office*